United States Patent
Le et al.

(10) Patent No.: US 9,629,264 B2
(45) Date of Patent: *Apr. 18, 2017

(54) DISPLAY DEVICE HOUSING AND FORM-FITTED CONFIGURATION

(71) Applicant: AMX LLC, Richardson, TX (US)

(72) Inventors: Phong Viet-Thanh Le, Lewisville, TX (US); Douglas N. Laube, Farmersville, TX (US)

(73) Assignee: AMX LLC, Richardson, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/985,990

(22) Filed: Dec. 31, 2015

(65) Prior Publication Data

US 2016/0113130 A1    Apr. 21, 2016

Related U.S. Application Data

(63) Continuation of application No. 14/156,573, filed on Jan. 16, 2014, now Pat. No. 9,280,175.

(51) Int. Cl.

| | |
|---|---|
| *G06F 1/16* | (2006.01) |
| *G02F 1/1333* | (2006.01) |
| *H05K 5/02* | (2006.01) |
| *G02F 1/01* | (2006.01) |
| *H04N 5/64* | (2006.01) |
| *F16M 13/02* | (2006.01) |
| *H05K 5/00* | (2006.01) |

(52) U.S. Cl.
CPC .......... *H05K 5/0204* (2013.01); *F16M 13/02* (2013.01); *G02F 1/0105* (2013.01); *G02F 1/133308* (2013.01); *G06F 1/1601* (2013.01); *G06F 1/1637* (2013.01); *H04N 5/64* (2013.01); *H05K 5/0004* (2013.01); *H05K 5/0017* (2013.01); *H05K 5/0221* (2013.01); *G02F 2201/465* (2013.01); *G06F 2200/1612* (2013.01)

(58) Field of Classification Search
CPC ... G02F 1/133308; G02F 2001/133311; G02F 2001/133314; G02F 2001/133317; G02F 2001/13332; G02F 2001/133322; G02F 2001/133325; G02F 2201/465; G06F 1/1601; G06F 1/1637; H04N 5/64
USPC .................................. 349/58–60; 361/679.24
See application file for complete search history.

(56) References Cited

U.S. PATENT DOCUMENTS

| | | | | |
|---|---|---|---|---|
| 5,455,743 A | * | 10/1995 | Miyajima | ............ H05K 5/0017 200/296 |
| 6,381,124 B1 | * | 4/2002 | Whitcher | .......... G02F 1/133308 248/917 |

(Continued)

*Primary Examiner* — Nidhi Thaker

(57) ABSTRACT

A display device housing and corresponding receiving bracket may provide a snap-in or screwless configuration to place a monitor into a wall bracket or self-standing display housing. In one example the apparatus includes a display housing that includes an electronic display affixed to a mounting bracket which rests along the perimeter of the electronic display and which comprises at least two spring loaded securing tabs, and a receiving bracket configured to house the display housing and the mounting bracket in a secure position with at least two receiving slots form-fitted to receive the at least two spring loaded securing tabs and provide a secure spring loaded locking position that maintains the display device housing and the mounting bracket in a locked position.

20 Claims, 19 Drawing Sheets

(56) References Cited

U.S. PATENT DOCUMENTS

| | | | |
|---|---|---|---|
| 7,097,143 B2* | 8/2006 | Kim | F16M 11/04 248/201 |
| 7,274,556 B2* | 9/2007 | Chung | F16M 11/00 248/121 |
| 7,760,289 B2* | 7/2010 | Nakanishi | G06F 1/1616 349/58 |
| 2004/0165344 A1* | 8/2004 | Lee | F16M 11/00 361/679.21 |
| 2009/0185341 A1* | 7/2009 | Jang | F16M 11/041 361/679.22 |
| 2011/0115347 A1* | 5/2011 | Xu | G06F 1/1679 312/223.1 |

\* cited by examiner

500

1500

1600

1700

1800

DISPLAY DEVICE HOUSING AND FORM-FITTED CONFIGURATION

CROSS-REFERENCE TO RELATED APPLICATIONS

This application is a continuation application of U.S. application Ser. No. 14/156,573, filed Jan. 16, 2014, entitled DISPLAY DEVICE HOUSING AND FORM-FITTED CONFIGURATION, the entire contents of which are incorporated by reference herein.

TECHNICAL FIELD OF THE APPLICATION

This application relates to an apparatus that includes a housing for a device insert, and more specifically to a housing that has a form-fitted enclosure that may be easily setup and maintained without the need for screws or bolts.

BACKGROUND OF THE APPLICATION

Conventionally, the design of a device (i.e., display monitor) housing is a rectangular box with various hardware components mounted inside the box which are otherwise hidden from an outside view. A bezel frame may be referred to as the outside frame around a computer or monitor device. The bezel frame or housing is affixed together as two or more parts, such as a front portion and a back portion which together form the housing. The housing is generally kept together by numerous screws which take time to put together and which can also be easily lost if the screws are separated from the housing portions. However, none of the previous device housings have been constructed to provide a hardware configuration that is comparable to example embodiments of the present application.

SUMMARY OF THE APPLICATION

Example embodiments may provide an apparatus that includes a display housing that includes an electronic display affixed to a mounting bracket which rests along a perimeter of the electronic display and which comprises at least two spring loaded securing tabs, and a receiving bracket configured to house the display housing and the mounting bracket with at least two receiving slots form-fitted to receive the at least two spring loaded securing tabs and provide a secure spring loaded locking position that maintains the display device housing and the mounting bracket in a locked position.

Another example embodiment may include an apparatus that includes a device insert affixed to a mounting bracket which comprises at least two spring loaded securing tabs, and a receiving bracket configured to house the device insert and the mounting bracket in a secure position that has at least two receiving slots form-fitted to receive the at least two spring loaded securing tabs, and at least two recessed spring loaded wall securing tabs on opposite sides of the receiving bracket configured to provide a locking position against a resting surface of a wall where the receiving bracket is mounted.

DETAILED DESCRIPTION OF THE APPLICATION

It will be readily understood that the components of the present application, as generally described and illustrated in the figures herein, may be arranged and designed in a wide variety of different configurations. Thus, the following detailed description of the embodiments of an apparatus, as represented in the attached figures, is not intended to limit the scope of the application as claimed, but is merely representative of selected embodiments of the application.

The features, structures, or characteristics of the application described throughout this specification may be combined in any suitable manner in one or more embodiments. For example, the usage of the phrases "example embodiments", "some embodiments", or other similar language, throughout this specification refers to the fact that a particular feature, structure, or characteristic described in connection with the embodiment may be included in at least one embodiment of the present application. Thus, appearances of the phrases "example embodiments", "in some embodiments", "in other embodiments", or other similar language, throughout this specification do not necessarily all refer to the same group of embodiments, and the described features, structures, or characteristics may be combined in any suitable manner in one or more embodiments.

Figure 1:
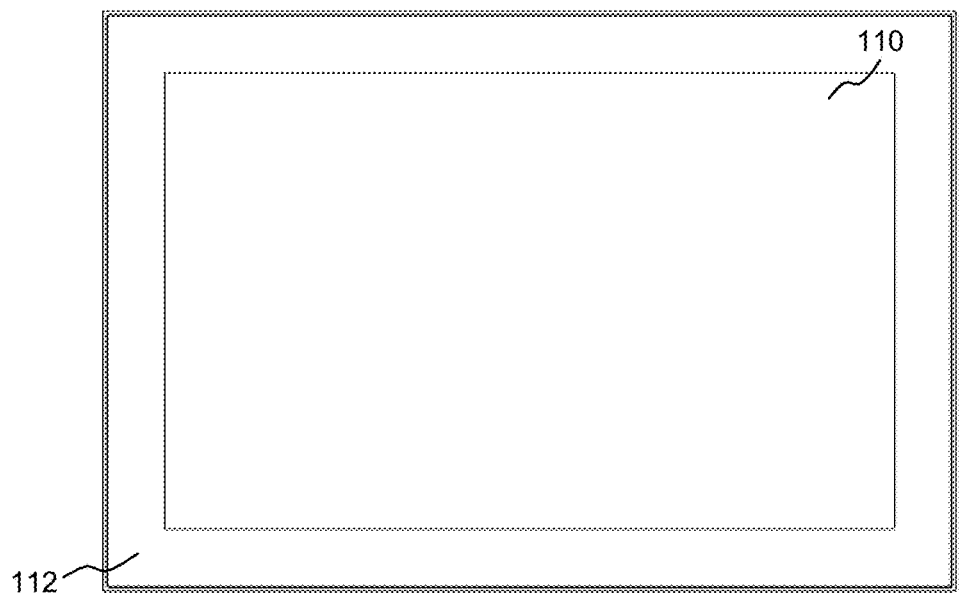
FIG. 1 is a front view of a display device.

FIG. 1 is a front view of a display device. Referring to FIG. 1, the display device 100 includes a main display area 110, such as a liquid crystal display (LCD), light-emitting diode (LED), and/or cathode ray tube (CRT) type of display device. The display front portion may also include a border, frame and/or a surrounding support structure or bracket 112 which supports the display and the corresponding display components which may be mounted to a rear housing, a free-standing display holder and/or a wall bracket.

Figure 2:
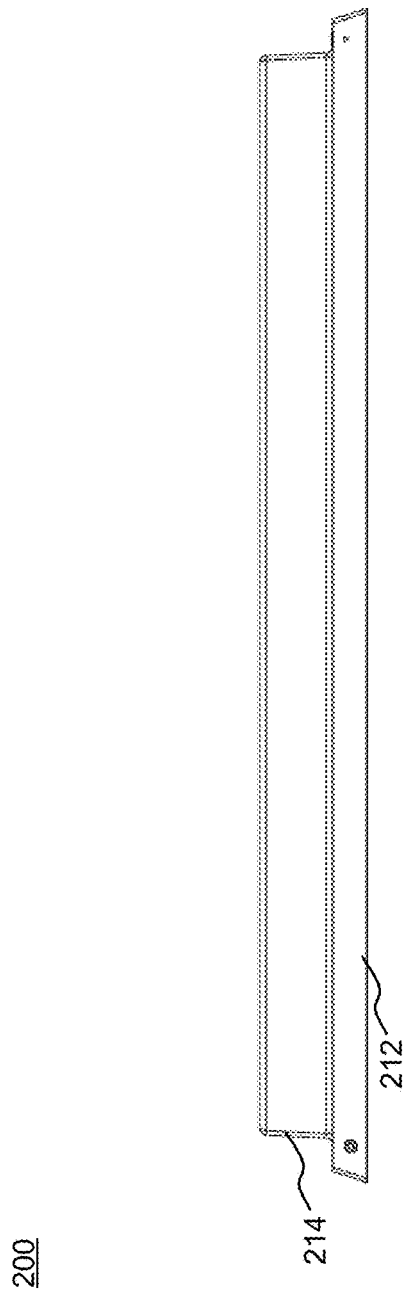
FIG. 2 is a top elevational view of the display device.

FIG. 2 is a top elevational view of the display device 200. Referring to FIG. 2, the display border 212 illustrates the display area, and the display frame 214 supports the rear display hardware and controls, including one or more of an A/C adapter, a graphics display card, a memory, a power supply, and/or control buttons, etc.

Figure 3:
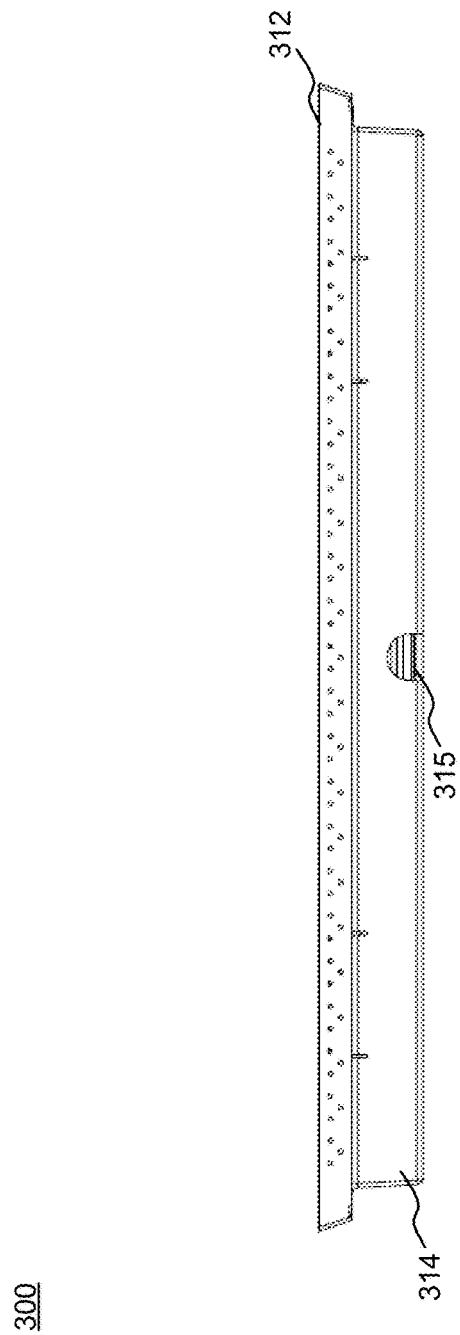
FIG. 3 is a bottom view of the display device.

FIG. 3 is a bottom view of the display device 300. The display border 312 includes vent holes to allow heat to dissipate away from the frame. The display enclosure 314 encloses the various display hardware and the support slot 315 permits a support structure to be integrated with the display enclosure 314.

Figure 4:
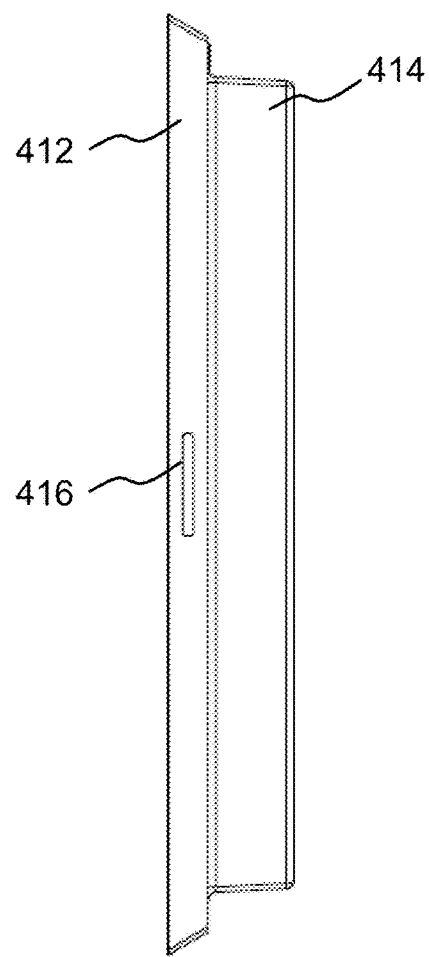
FIG. 4 is a right side view of the display device.

FIG. 4 is a right side view (with respect to the front of the display) of the display device. Referring to FIG. 4, this view 400 provides a side perspective of the display frame 412, the display enclosure 414 and the light emitting diode (LED) 416 which may provide an indicator to persons seeking access to the display. For example, the LED 416 may provide a first color "red" when a scheduled meeting is in session, or a second color "yellow" when the meeting is near its end or the scheduled time frame is complete. The color "green" may indicate that the monitor is free to use in a conference room type of setting so the persons approaching the monitor may view the current status of the monitor. A scheduling program or application may integrate with the monitor's controls and the monitor's integrated circuit to change the LED 416 when the time frame is over or is about to end or other indicator, etc.

Figure 5:
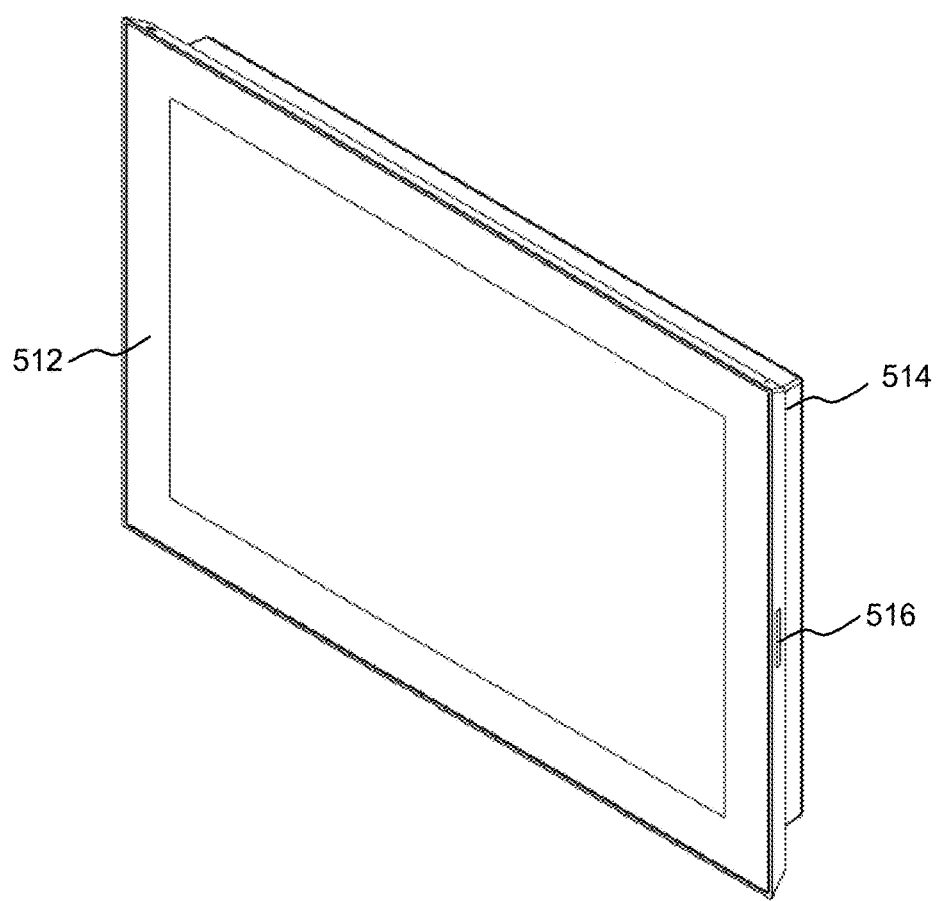
FIG. 5 is a front right side elevational view of the display device.

FIG. 5 is a front right side elevational view of the display device. The side view 500 provides a view of the display frame 512 and the display enclosure 514. The LED 516 provides a source of light indicator to those persons seeking access to the monitor or its corresponding presentation area.

Figure 6:
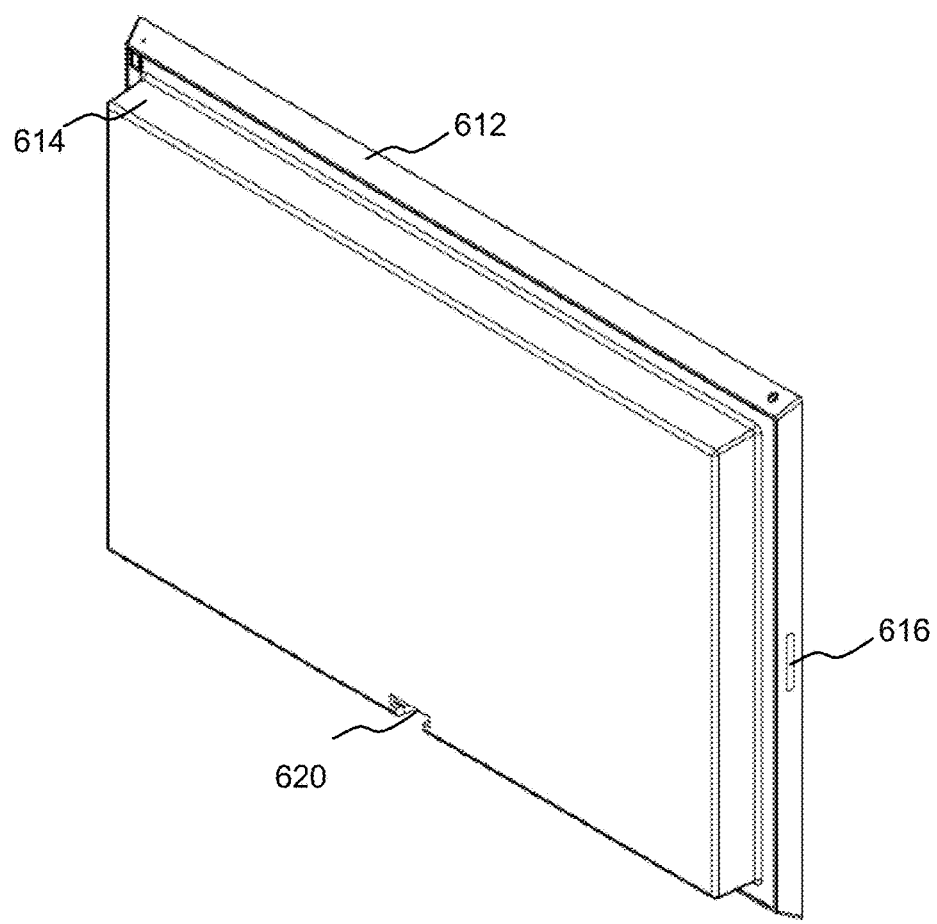
FIG. 6 is a rear right side elevational view of the display device.

FIG. 6 is a rear right side elevational view of the display device 600. Referring to FIG. 6, the display frame 612 and the display enclosure 614 together form a housing to protect the display device controls. The support slot 620 provides a form-fitted snap configuration for a support structure (not shown) to be invited into the support slot for free-standing support. The LED 616 provides an indicator to the persons seeking access to the monitor.

Figure 7:
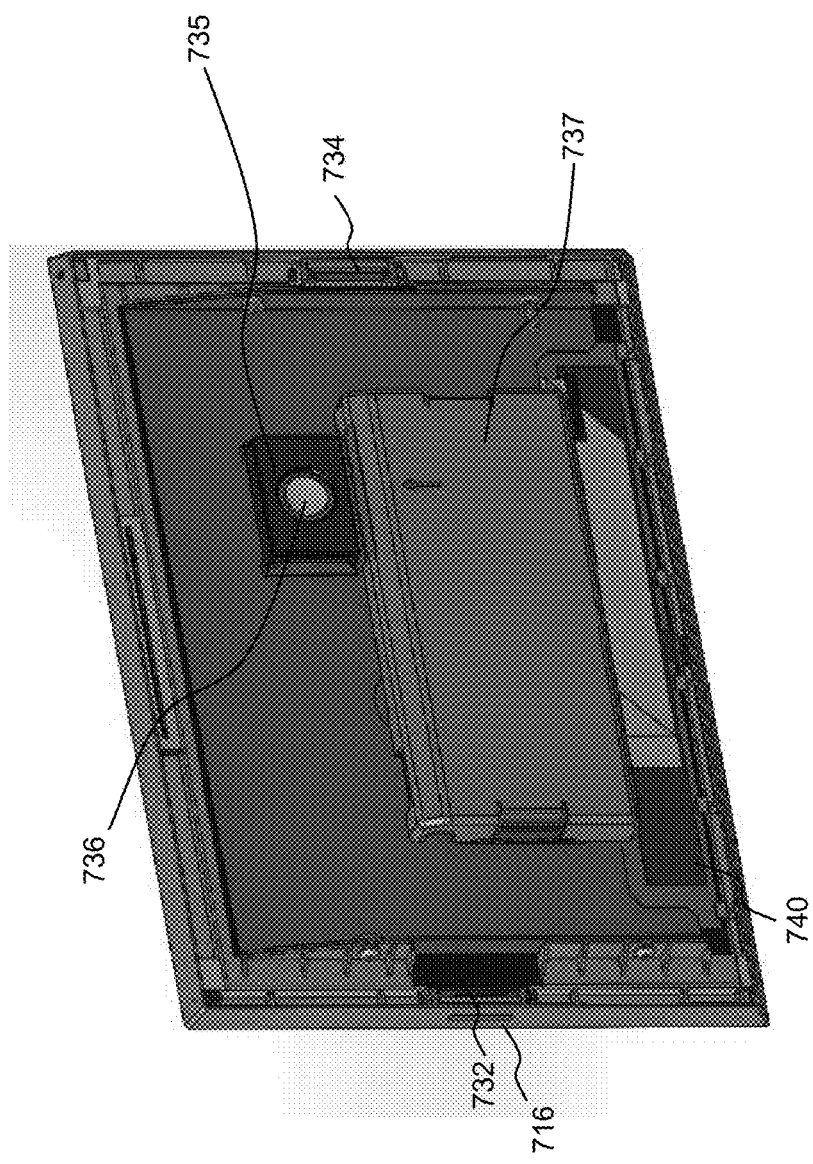
FIG. 7 is an internal view of the backside of the main display device portion and the corresponding front mounting bracket.

FIG. 7 is an internal view of the backside of the main/front display device portion. Referring to FIG. 7, the internal view 700 provides a view of the internal display components, such as but not limited to the LED 716, the securing tabs 732 and 734, a camera assembly 735 and corresponding camera lens 736, integrated circuit (IC) hardware and related controls 737 and a data bus and/or power supply portion 740. When placing the main/front display device portion into a rear device housing, the tabs 732 and 734 may be spring loaded tabs that meet with affixing slots or receiving tabs on the rear device cover portion. The slots and tabs provide an easy form-fitted configuration to securely combine the front and rear portions of the display housing and to remove the front and rear portions at any time. The tabs 732 and 734 may slide through the receiving slots on the rear cover and into form-fitted slots which keep the tabs in place from a certain degree of tension provided by a spring and/or torsion force of the tabs position in the corresponding slots or via a spring that lies beneath the tabs that provides an upward force when the tabs are depressed or deformed inward. The examples illustrated in FIGS. 1-7 relate to an ultra-thin bezel frame and corresponding display device configuration. The examples illustrated in FIGS. 8-14 refer to a similar configuration with a deeper device housing and/or display portion.

Figure 8:
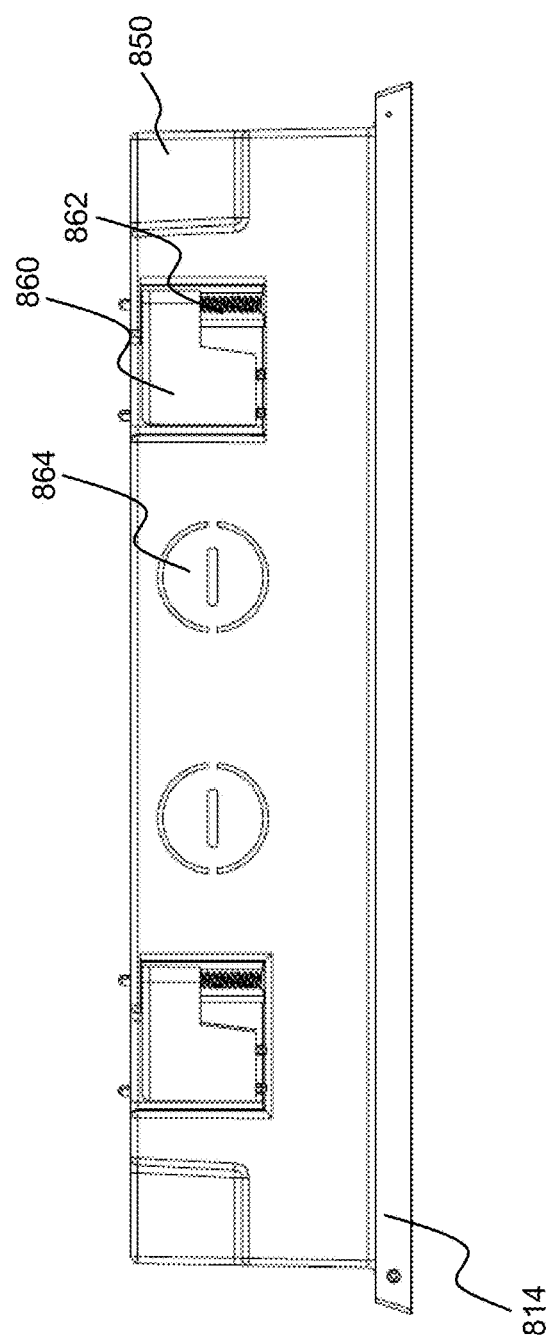
FIG. 8 is a top elevational view of a display device rear cover housing according to an alternative example embodiment.

FIG. 8 is a top elevational view of a display device 800 according to an alternative example embodiment. Referring to FIG. 8, in this example the bezel frame 814 and the corresponding controls may be wider and deeper than in the previous examples. Both the different example embodiments in FIGS. 1-7 and 8-14 may be wall-mounted displays or free-standing table-top stands. Each of the examples may also provide a common frame bezel for all mounting needs whether the sizes are 4.3 inches, 7 inches, 10 inches, etc. The ultra-thin slim design may be for 1 inch or less in thickness. The frame may also provide a grounding path for the electronics without any additional wiring.

In FIG. 8, the display frame 814 is attached to a rear housing portion including cut-out and/or beveled corners 850 and receiving slots 864. The rear housing portion includes tabs 860 in either both the left and right sides of the top portion and/or or two locations on the bottom portion providing 2, 4 or more tabs 860 to assist with form-fitted snapping into place when mounting the display onto a wall mount bracket or other mounting bracket. The tabs 860 are spring loaded via a corresponding spring 862 and provide resistance when pressed downward into the direction of the device housing. This enables the frame to stay in a fixed position against a wall mount bracket or via a set of receiving slots.

Figure 9:
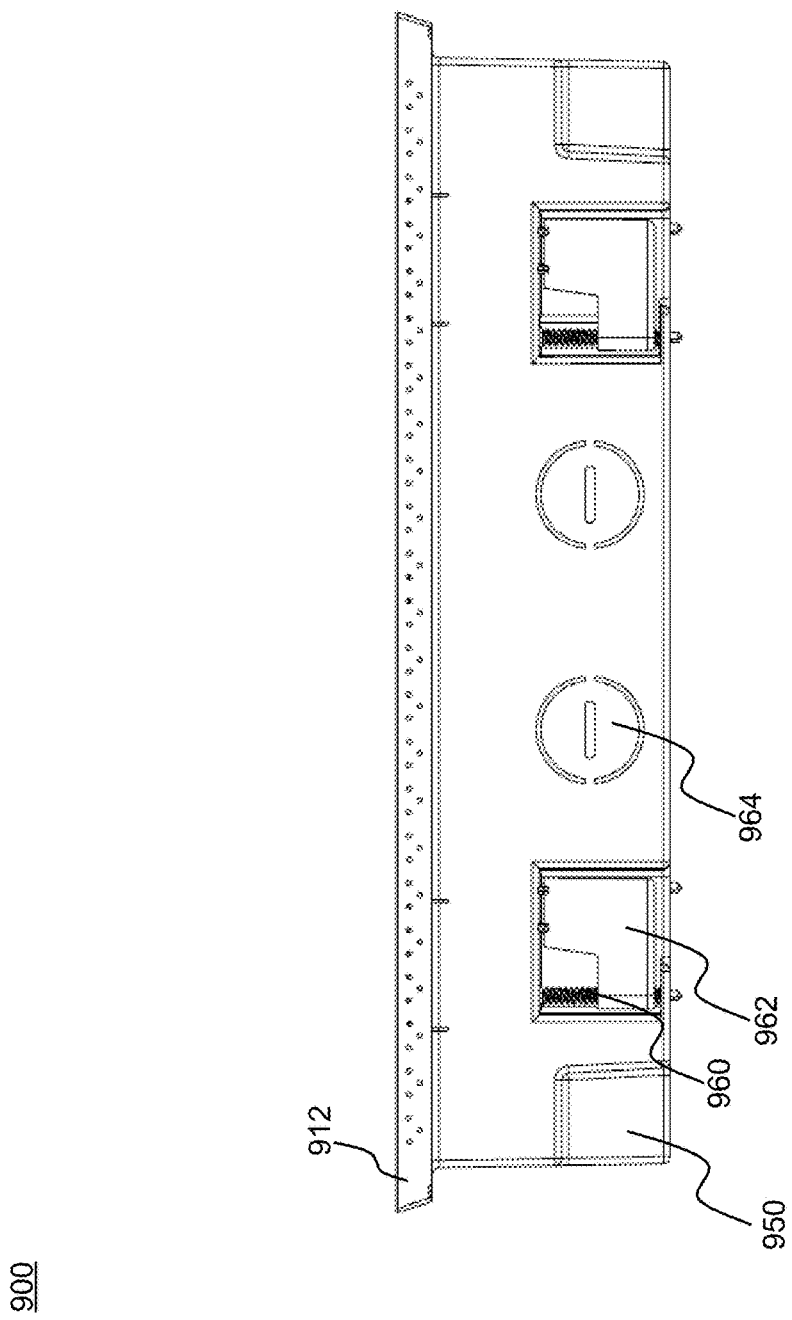
FIG. 9 is a bottom view of the display device rear cover housing according to the alternative example embodiment.

FIG. 9 is a bottom view of the display device 900 according to the alternative example embodiment. In FIG. 9, the display frame 912, the receiving slots 964, the beveled corners 950 and the tabs 962 and springs 960 are all similar to the configuration on the top portion of the display frame. The bottom may be the same or may have more or fewer securing tabs than the top portion. Both the sides may also be the same or may have more, less or no securing tabs.

Figure 10:
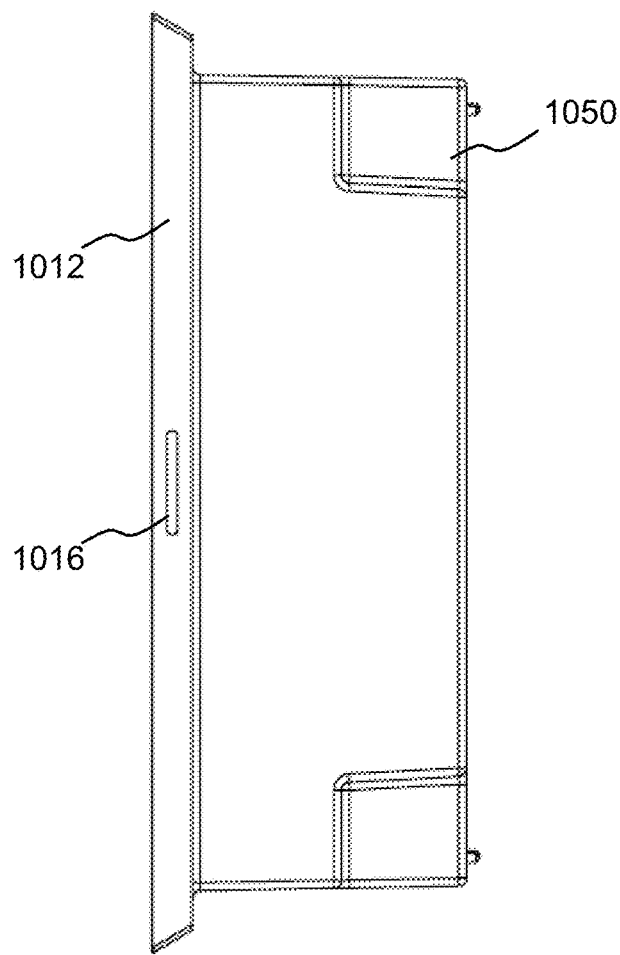
FIG. 10 is a right side perspective of the internal display device and rear housing according to the alternative example embodiment.

FIG. 10 is a side perspective of the internal display device 1000 according to the alternative example embodiment. The display frame 1012 and the LED 1016 are shown on one side of the display device and the cut-out or beveled corners 1050 may also be observed from this perspective.

Figure 11:
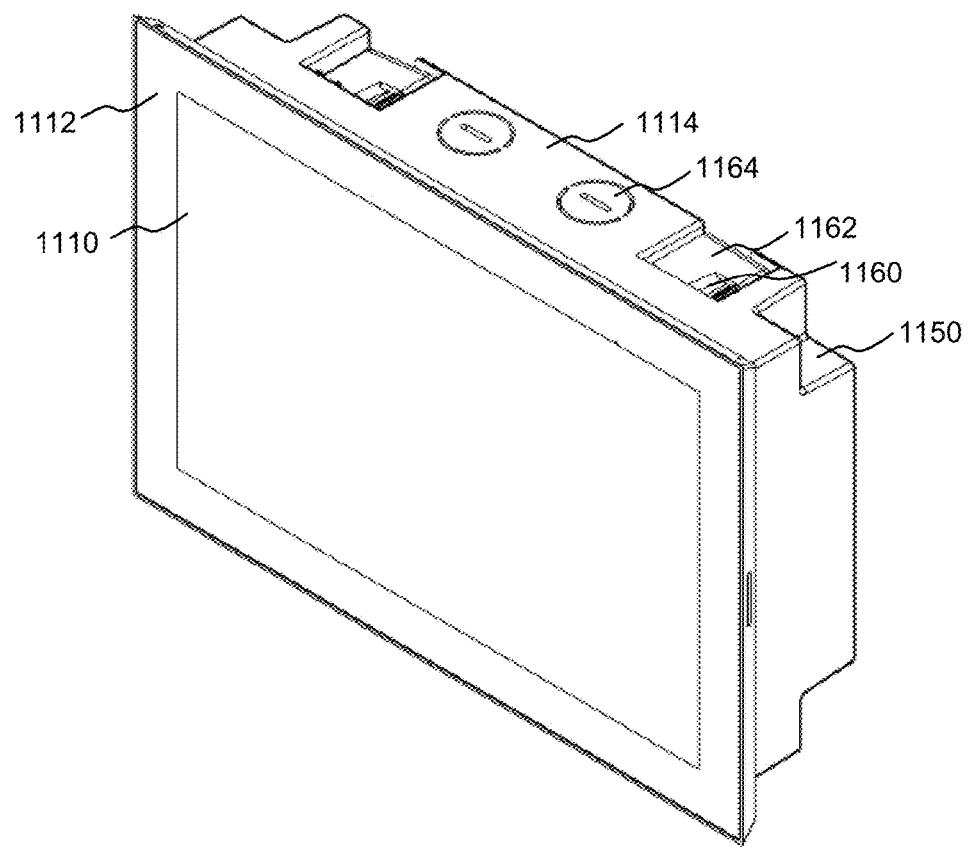
FIG. 11 is a right-side elevational view of the display device and the corresponding rear display device housing according to the alternative example embodiment.

FIG. 11 is a right-side elevational view 1100 of the display device according to the alternative example embodiment. In FIG. 11, most of the slots and corners can be observed. The display 1110 and the display frame 1112 are shown as being affixed to the rear display area 1114 with the receiving slots 1164, the form-fitted tabs 1162 and corresponding spring configuration 1160 and the beveled corners 1150.

Figure 12:
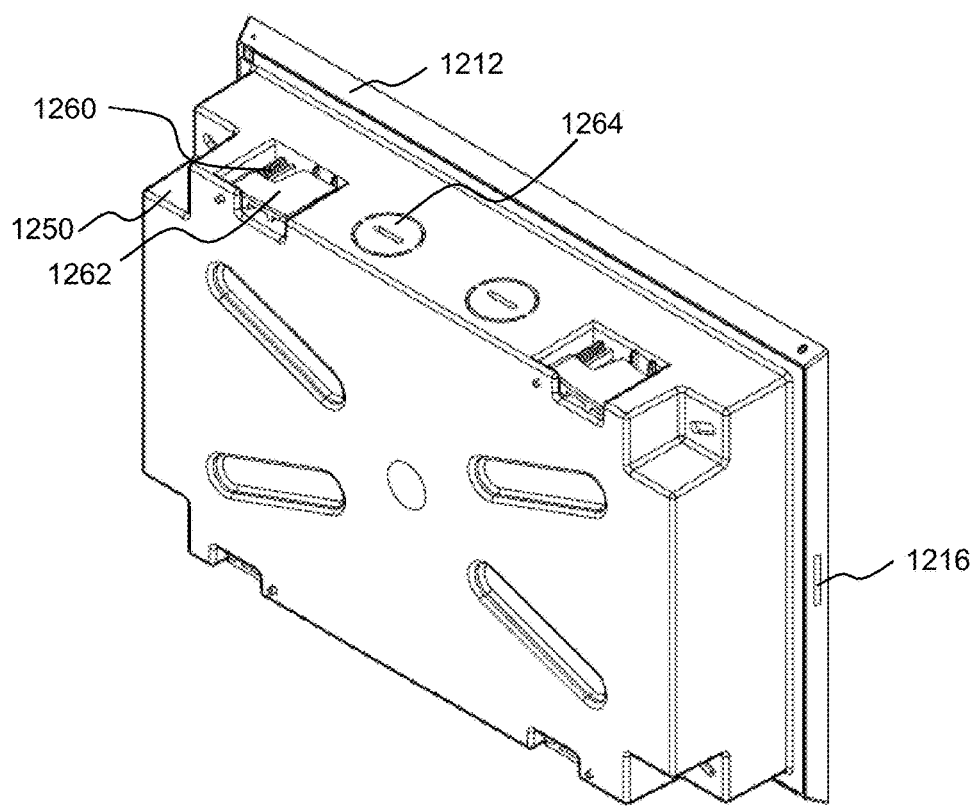
FIG. 12 is a rear right-side elevational view of the display device according to the alternative example embodiment.

FIG. 12 is a rear right-side elevational view 1200 of the display device according to the alternative example embodiment. Similar to FIG. 12, the rear housing portion includes the display frame 1212, receiving slots 1264, the LED 1216, the beveled corners 1250, and the spring loaded tabs 1262 affixed to the springs 1260. The housing configuration may be easily pressed against a wall mounted bracket and locked into place for secure and fast setup, replacement and maintenance.

Figure 13A:
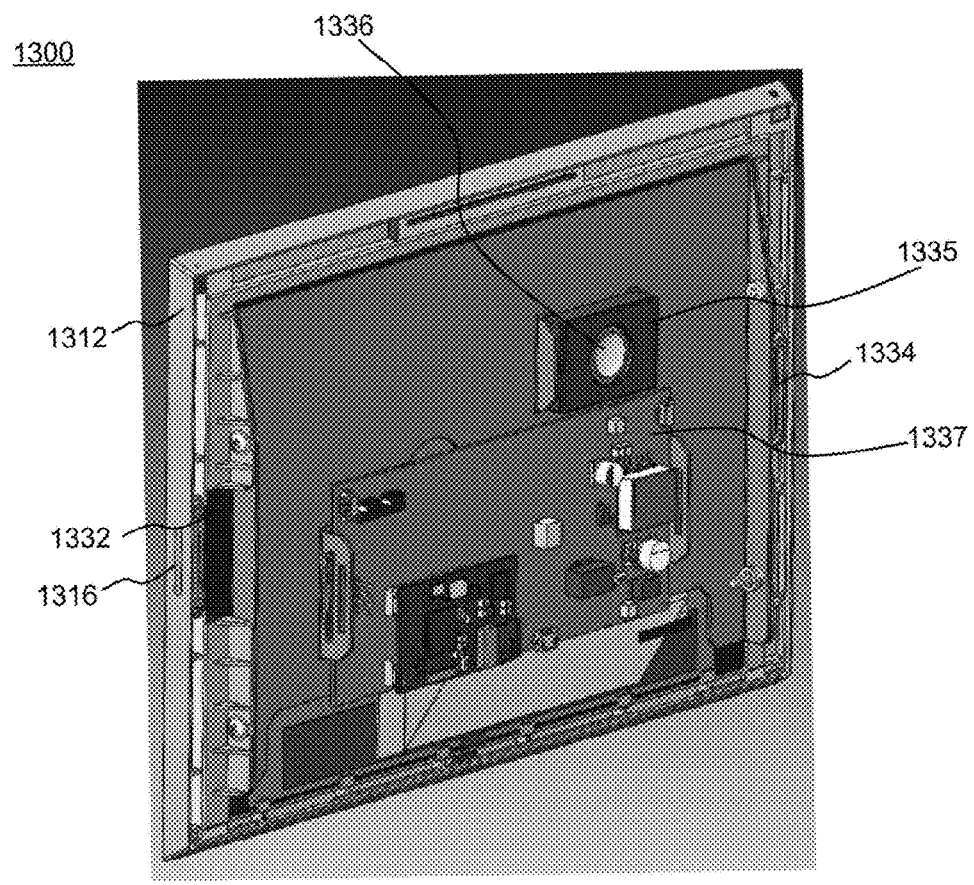
FIG. 13A is another internal view of the backside of the main display device portion.

FIG. 13A is another internal view of the backside 1300 of the main display device portion. Referring to FIG. 13A, the internal view provides a view of the internal display components, such as but not limited to the frame 1312, LED 1316, the securing tabs 1332 and 1334, a camera assembly

1335 and corresponding camera lens 1336, integrated circuit (IC) hardware and related controls 1337 and a data bus and/or power supply portion. When placing the main/front display device 1312 into a rear device housing, the tabs 1332 and 1334 may be met with affixing slots or receiving tabs on the rear device cover portion. The slots and tabs provide an easy form-fitted configuration to securely combine the front and rear portions of the display housing. The tabs 1332 and 1334 may slide through the receiving slots on the rear cover and into form-fitted slots which keep the tabs in place due to a certain degree of tension provided by a spring or torsion force of the tabs position in the corresponding slots.

Figure 13B:
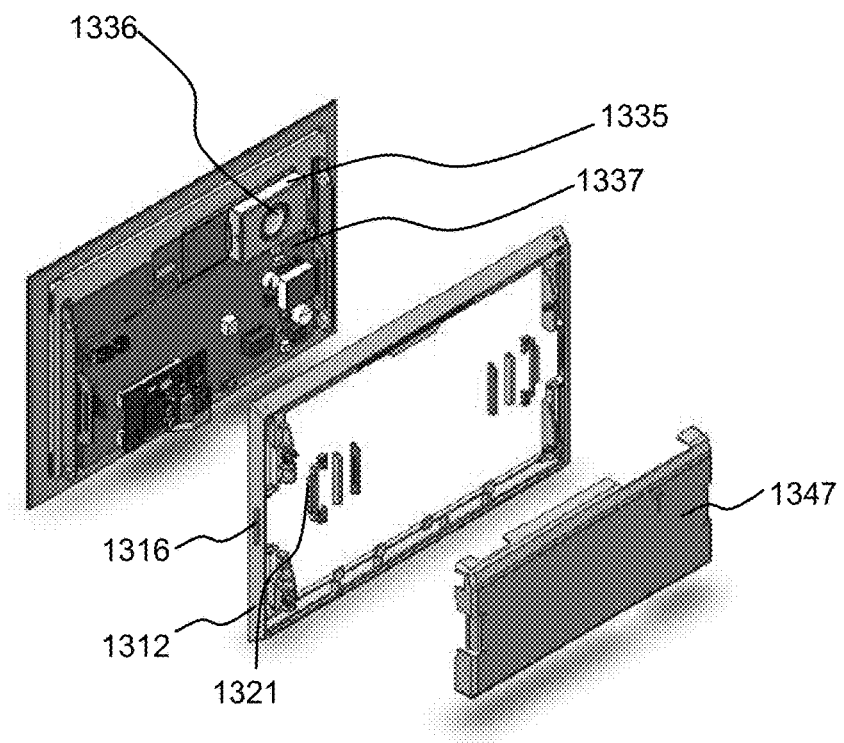
FIG. 13B is an exploded view of the backside of the main display device portion, the display mounting bracket and the integrated circuit cover.

FIG. 13B is an exploded view 1350 of the internal components of the backside of the main display device portion. Referring to FIG. 13B, the internal view provides a view of the internal display components, such as but not limited to the LED 1316, a camera assembly 1335 and corresponding camera lens 1336, integrated circuit (IC) hardware and related controls 1337 and a data bus and/or power supply portion. When placing the main/front display device portion into a device mounting bracket 1312, the tabs may be met with affixing slots or receiving tabs on the rear device cover portion. The slots and tabs provide an easy form-fitted configuration to securely combine the front and rear portions of the display housing. The tabs may slide through the receiving slots on the rear cover and into form-fitted slots which keep the tabs in place from a certain degree of tension provided by a spring or torsion force of the tabs position in the corresponding slots. The IC cover 1347 covers the IC 1337 and is snapped into place by position and tension clips 1321 which are located on both sides of the rear cover 1347 and both sides of the rear side of the main display.

According to one example embodiment, a display housing may include an electronic display affixed to a mounting bracket which rests along the perimeter of the electronic display and which comprises at least two spring loaded securing tabs. The tabs may be opposite one another on opposite sides of the securing bracket. The securing bracket may be affixed to the display to provide a conforming bracket to be mounted to a rear housing which in turn may be mounted to a wall bracket. The apparatus may also include a receiving bracket configured to house the display housing and the mounting bracket in a secure position with at least two receiving slots form-fitted to receive the at least two spring loaded securing tabs and provide a secure spring loaded locking position that maintains the display device housing and the mounting bracket in a locked position. The tabs may have a resting lip that the spring loaded tabs may rest against to reduce slipping or movement once placed in a fixed position.

The rear portion of the display may include an integrated circuit mounted to a rear surface and an integrated circuit cover configured to be mounted into a fixed position that covers the integrated circuit. The circuit cover may be mounted similar to the device bracket being mounted to a rear housing with two or more securing tabs that fit into receiving tabs of the circuit cover.

In another example, the two spring loaded wall securing tabs may instead include four spring loaded wall securing tabs with two spring loaded wall securing tabs on one side of the receiving bracket and two spring loaded wall securing tabs on a side opposite the one side. The spring loaded wall securing tabs are recessed into a body of the receiving bracket. The spring loaded wall securing tabs may include two spring loaded wall securing tabs with one spring loaded wall securing tab on one side of the receiving bracket and one spring loaded wall securing tab on a side opposite the one side.

In another example, the bracket and insert device may include any type of device insert that is affixed to a mounting bracket which includes at least two spring loaded securing tabs and a receiving bracket configured to house the device insert and the mounting bracket in a secure position including at least two receiving slots form-fitted to receive the at least two spring loaded securing tabs, and at least two recessed spring loaded wall securing tabs on opposite sides of the receiving bracket.

Figure 14:
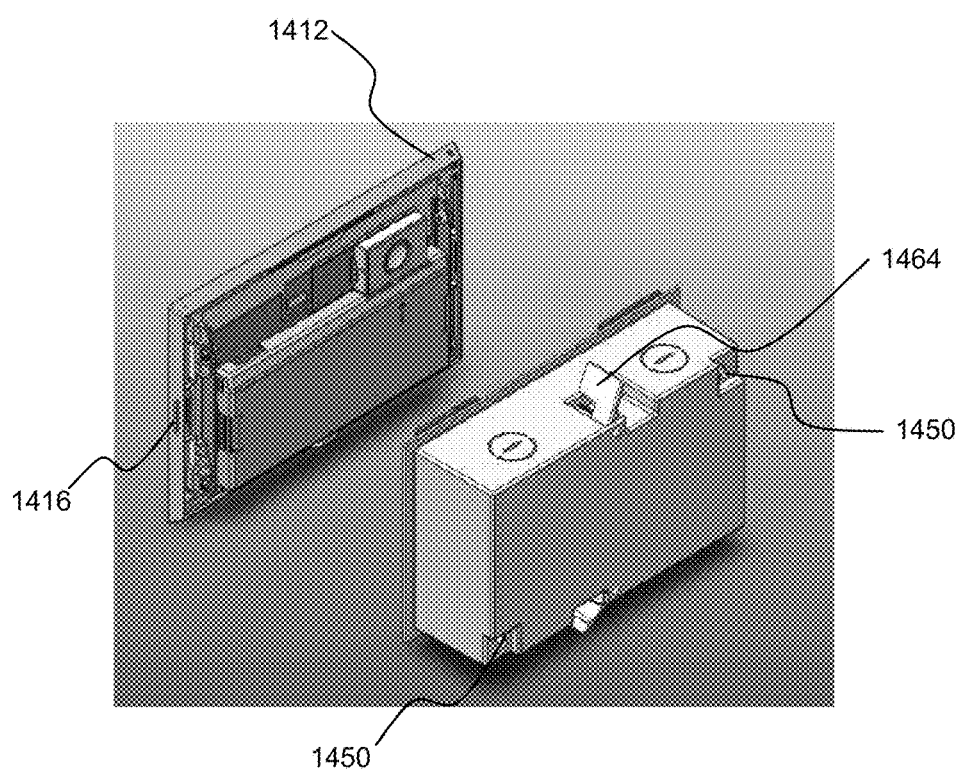
FIG. 14 is a rear left-side elevational view of a display device according to another alternative example embodiment.

FIG. 14 is another rear right-side elevation view 1400 of a display device according to another alternative example embodiment. Referring to FIG. 14, the cover 1412 includes a slot for an LED indicator 1416. As for the rear housing portion, in this example the rear housing has only one spring loaded secure wall mounting tab 1464 on the top portion of the housing. Similar to FIG. 12, the rear housing portion includes the display frame, the LED 1416, the beveled corners 1450, and the spring loaded wall mount tab 1464 affixed to a spring (not shown). The housing configuration may be easily pressed against a wall mounted bracket and locked into place for secure and fast setup, replacement and maintenance. In this example of FIG. 14, one tab per side is used instead of two per side as in FIG. 12.

Figure 15:
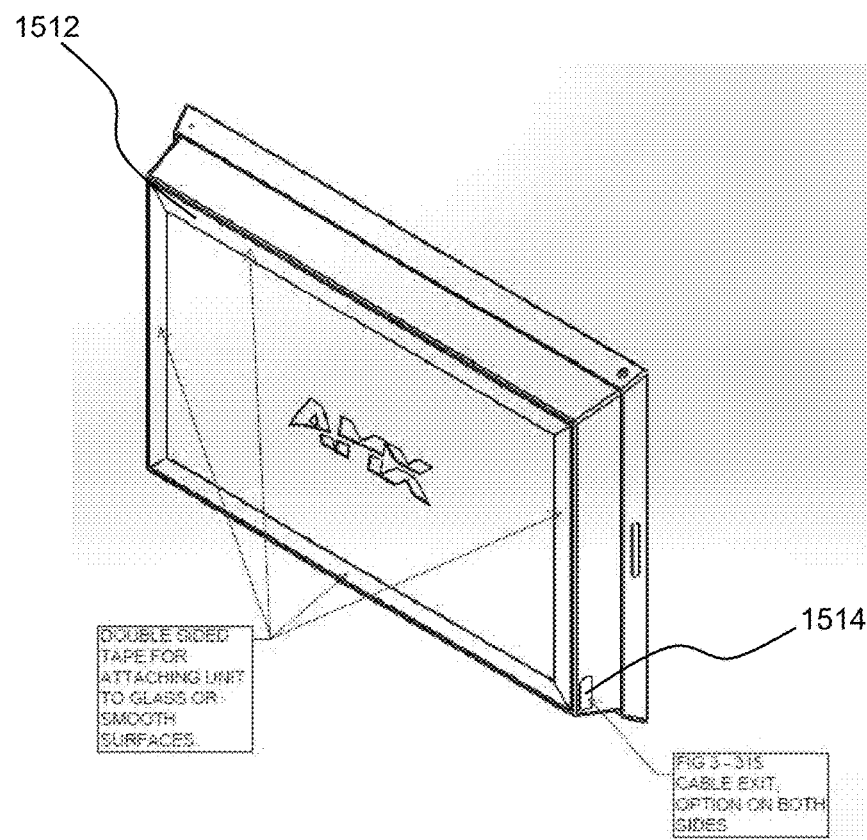
FIG. 15 is a rear angled view of a display monitor housing with a double sided adhesive and cable exit slot configuration according to example embodiments.
Figure 16:
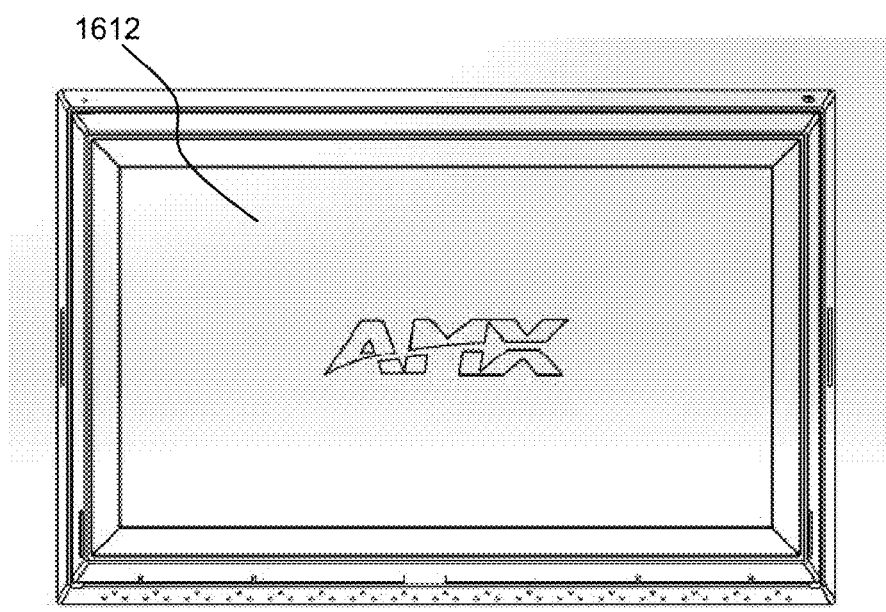
FIG. 16 is a direct rear view of the display monitor housing with a double sided adhesive configuration according to example embodiments.

FIG. 15 is a rear angled view of a display monitor housing with a double sided adhesive and cable exit slot configuration according to example embodiments. Referring to FIG. 15, the rear view configuration 1500 illustrates a back cover and perimeter of double-sided adhesive 1512 that may be used to hold the display device into a slot or wall mount position. The rear cover may also have one or more cable exits 1514 which are small (i.e., less than 1 square inch) removable sections that provide a slot for network and/or power cables to traverse through the cover and contact the electronic circuitry. FIG. 16 is a direct rear view of the display monitor housing with a double sided adhesive configuration according to example embodiments. In this configuration 1600, the rear cover 1612 is shown from a direct rear view which is the same as the rear cover of FIG. 15.

Figure 17:
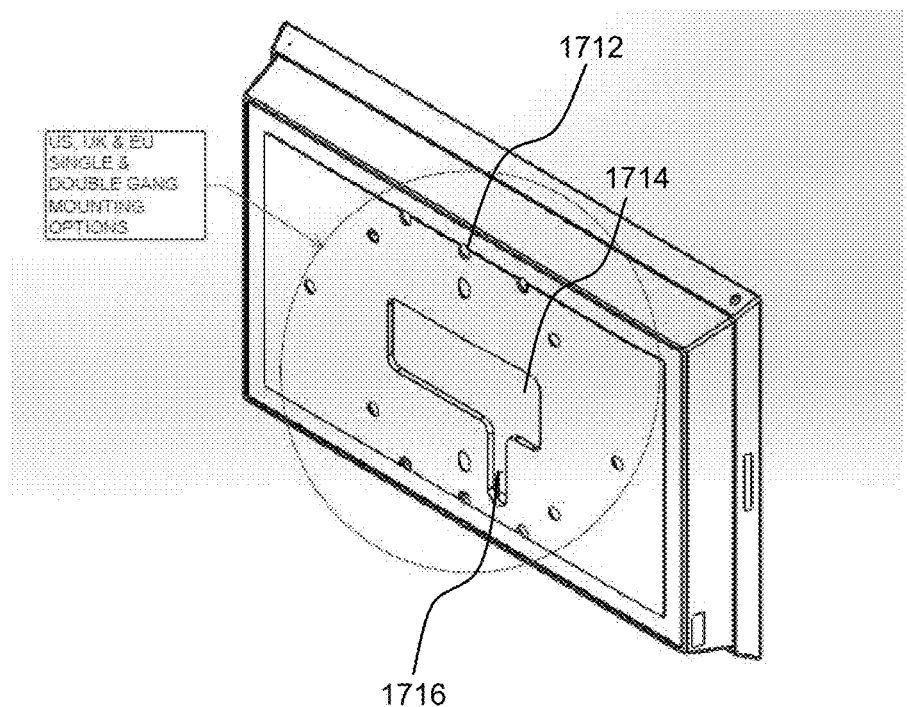
FIG. 17 is a rear angled view of an internal portion of the display monitor housing and its corresponding mounting configuration according to example embodiments.
Figure 18:
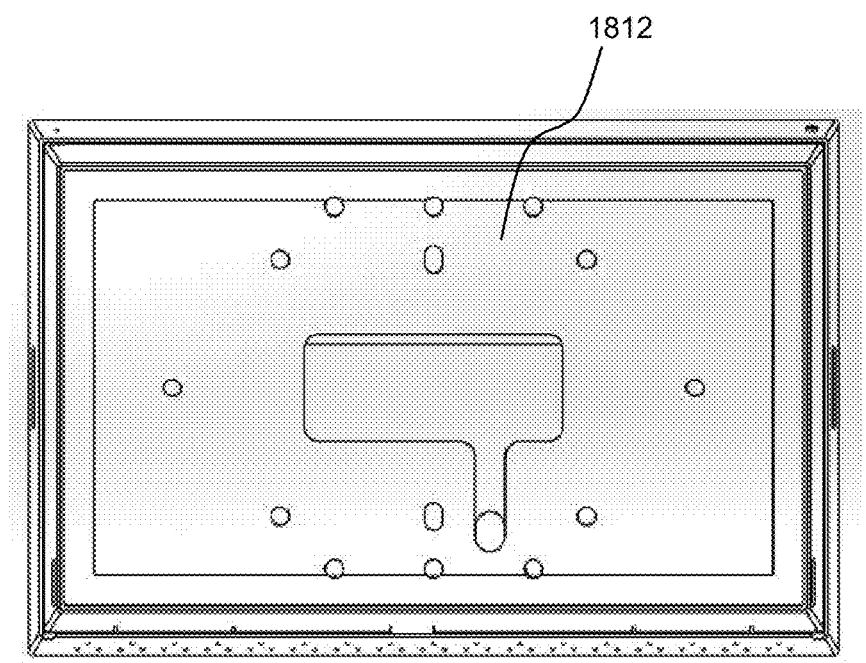
FIG. 18 is a direct rear view of the display monitor housing configuration according to example embodiments.

FIG. 17 is a rear angled view of an internal portion of the display monitor housing and its corresponding mounting configuration according to example embodiments. Referring to FIG. 17, the back cover 1700 may have a series of mounting holes 1712 and/or single or double gang mounting options including a large (greater than 2 square inches) cross-sectional portion 1714 and a smaller cross-section (less than 2 square inches) passage portion 1716 for a bolt or other wide headed receiving portion to support the display on a wall or other mounting surface. FIG. 18 is a direct rear view of the display monitor housing configuration of FIG. 17 according to example embodiments. Referring to FIG. 18, the rear view 1800 illustrates a large mounting plate 1812 with various holes and mounting options similar to FIG. 17.

It will be readily understood that the components of the application, as generally described and illustrated in the figures herein, may be arranged and designed in a wide variety of different configurations. Thus, the detailed description of the embodiments is not intended to limit the scope of the application as claimed, but is merely representative of selected embodiments of the invention.

One having ordinary skill in the art will readily understand that the application as discussed above may include hardware elements in configurations that are different than those which are disclosed. Therefore, although the application has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

What is claimed is:

1. An apparatus, comprising:
   a display housing comprising an electronic display affixed to a mounting bracket which comprises at least one spring loaded securing tab disposed in at least one cavity beneath a planar surface of the mounting bracket; and
   a receiving bracket configured to house the display housing and the mounting bracket with at least one receiving slot to receive the at least one spring loaded securing tab that maintains the display device housing and the mounting bracket in a locked position;
   wherein the receiving bracket comprises at least one spring loaded wall securing tab which holds the receiving bracket and the display housing into a wall mount bracket;
   wherein the at least one spring loaded wall securing tab is recessed into a body of the receiving bracket.

2. The apparatus of claim 1, wherein the at least one spring loaded tab is on at least one opposite side of the mounting bracket.

3. The apparatus of claim 1, wherein the at least one spring loaded tab includes a lip that provides a resting surface for the at least one spring loaded securing tab.

4. The apparatus of claim 1, further comprising:
   an integrated circuit mounted to a rear surface of the display housing; and
   an integrated circuit cover configured to be mounted into a fixed position that covers the integrated circuit.

5. The apparatus of claim 4, wherein the integrated circuit comprises at least one securing tab and the integrated circuit cover comprises at least one engaging tab which hold the integrated circuit cover into a fixed position that covers the integrated circuit.

6. The apparatus of claim 1, wherein the at least one engaging tab comprises a lip that the at least one securing tab rests against to keep the integrated circuit cover into the fixed position.

7. The apparatus of claim 1, further comprising at least one light emitting diode (LED) protruding from a portion of the display housing and wired to the integrated circuit.

8. The apparatus of claim 1, further comprising a camera assembly mounted to the rear portion of the display housing and wired to the integrated circuit.

9. The apparatus of claim 1, wherein the mounting bracket rests along a perimeter of the electronic display.

10. The apparatus of claim 9, wherein the at least one spring loaded wall securing tab comprises at least: two spring loaded wall securing tabs with one spring loaded wall securing tabs on one side of the receiving bracket and one spring loaded wall securing tabs on a side opposite the one side.

11. The apparatus of claim 1, wherein a spring loaded force of the at least one spring loaded securing tab is provided by a corresponding spring affixed to one side of the securing tab.

12. The apparatus of claim 1, wherein the receiving bracket provides a secure spring loaded locking position that maintains the display device housing and the mounting bracket in the locked position.

13. An apparatus, comprising:
    a device insert affixed to a mounting bracket which comprises at least one spring loaded securing tab disposed in at least one cavity beneath a planar surface of the mounting bracket; and
    a receiving bracket configured to house the device insert and the mounting bracket in a secure position comprising:
       at least one receiving slot to receive the at least one spring loaded securing tab; and
       at least one recessed spring loaded wall securing tab on at least one side of the receiving bracket configured to provide a locking position against a resting surface of a wall where the receiving bracket is mounted;
    wherein the device insert is an electronic display device.

14. The apparatus of claim 13, wherein the at least one recessed spring loaded wall securing tabs comprises at least one tab on a side of the receiving bracket.

15. The apparatus of claim 13, wherein the at least one recessed spring loaded wall securing tab comprises at least two tabs wherein one tab is on a first side of the receiving bracket and another tab is on an opposite side to the first side of the receiving bracket.

16. The apparatus of claim 13, wherein a spring loaded force of the at least one spring loaded securing tab is provided by a corresponding spring affixed to one side of the securing tab.

17. An apparatus, comprising:
    a device insert affixed to a mounting bracket which comprises at least one spring loaded securing tab; and
    a receiving bracket configured to house the device insert and the mounting bracket in a secure position comprising:
       at least one receiving slot to receive the at least one spring loaded securing tab; and
       at least one recessed spring loaded wall securing tab on opposite sides of the receiving bracket configured to provide a lock position against a surface of a wall where the receiving bracket is mounted:
    wherein the device insert is an electronic display device.

18. The apparatus of claim 17, wherein the at least one recessed spring loaded wall securing tab comprises one tab on at least one side of the receiving bracket.

19. The apparatus of claim 17, wherein the at least one recessed spring loaded wall securing tab comprises at least two tabs wherein one tab is on a first side of the receiving bracket and another tab is on an opposite side to the first side of the receiving bracket.

20. The apparatus of claim 17, wherein a spring loaded force of the at least one spring loaded securing tab is provided by a corresponding spring affixed to one side of the securing tab.

* * * * *